United States Patent
Wernet et al.

(10) Patent No.: US 10,750,651 B2
(45) Date of Patent: Aug. 18, 2020

(54) METHOD OF PREPARING A SETUP KIT FOR A PLACEMENT MACHINE

(71) Applicant: SICK AG, Waldkirch/Breisgau (DE)

(72) Inventors: Danny Wernet, Freiburg (DE); Fabian Schmidt, Teningen (DE); Bernhard Füger, Offenburg (DE)

(73) Assignee: SICK AG, Waldkirch (DE)

( * ) Notice: Subject to any disclaimer, the term of this patent is extended or adjusted under 35 U.S.C. 154(b) by 22 days.

(21) Appl. No.: 16/162,734

(22) Filed: Oct. 17, 2018

(65) Prior Publication Data

US 2019/0124808 A1   Apr. 25, 2019

(30) Foreign Application Priority Data

Oct. 19, 2017   (EP) ..................................... 17197315

(51) Int. Cl.
*H05K 13/08* (2006.01)
*H05K 13/04* (2006.01)

(52) U.S. Cl.
CPC ..... *H05K 13/0882* (2018.08); *H05K 13/0404* (2013.01); *H05K 13/0465* (2013.01); *H05K 13/0482* (2013.01); *H05K 13/085* (2018.08); *H05K 13/086* (2018.08)

(58) Field of Classification Search
CPC ........... H05K 13/0882; H05K 13/0404; H05K 13/085; H05K 13/0482; H05K 13/00
See application file for complete search history.

(56) References Cited

U.S. PATENT DOCUMENTS

| | | | | |
|---|---|---|---|---|
| 5,258,915 A | * | 11/1993 | Billington | .............. G06Q 10/04 700/103 |
| 10,327,370 B2 | * | 6/2019 | Pfaffinger | ............ G05B 19/042 |
| 2011/0066992 A1 | * | 3/2011 | Sandy | ................. G06F 17/5045 716/122 |

(Continued)

FOREIGN PATENT DOCUMENTS

| | | |
|---|---|---|
| CN | 1742529 A | 3/2006 |
| CN | 1831686 A | 9/2006 |

(Continued)

OTHER PUBLICATIONS

European Search Report dated Apr. 5, 2018 issued in corresponding European Application No. 17197315.9.

(Continued)

*Primary Examiner* — Vincent H Tran
(74) *Attorney, Agent, or Firm* — Nath, Goldberg & Meyer; Jerald L. Meyer

(57) ABSTRACT

The invention relates to a method of preparing a setup kit for at least one placement machine, wherein the placement machine serves for the placement of components on/at assemblies, and wherein
those components that are required for the assemblies for a plurality of different assemblies to be manufactured are determined by means of the placement machine;
possible setup kits for the placement machine are prepared iteratively from the determined components, with each setup kit comprising a plurality of components;
an optimized setup kit is selected from the setup kits by means of an electronic processing device in the method.

20 Claims, 1 Drawing Sheet

(56) References Cited

U.S. PATENT DOCUMENTS

| | | | |
|---|---|---|---|
| 2012/0004762 A1* | 1/2012 | Bauer | H05K 13/085 |
| | | | 700/219 |
| 2015/0195965 A1* | 7/2015 | Craiovan | H05K 13/08 |
| | | | 29/593 |
| 2017/0311491 A1* | 10/2017 | Pfaffinger | H05K 13/08 |
| 2017/0318716 A1* | 11/2017 | Pfaffinger | H05K 13/085 |
| 2019/0213508 A1* | 7/2019 | Pfaffinger | G06Q 10/04 |

FOREIGN PATENT DOCUMENTS

| | | |
|---|---|---|
| CN | 1878460 A | 12/2006 |
| CN | 1989795 A | 6/2007 |
| CN | 102762086 A | 10/2012 |
| CN | 104620187 A | 5/2015 |
| DE | 19834620 A1 | 3/1999 |
| DE | 102014222936 A1 | 5/2016 |
| EP | 0478360 A1 | 4/1992 |
| JP | 2017-112135 A | 6/2017 |

OTHER PUBLICATIONS

Search report for corresponding European application No. 17 197 315.9 dated Feb. 7, 2020.
Office Action dated Apr. 29, 2020 issued in corresponding Chinese Application No. 201811217713.8.

* cited by examiner

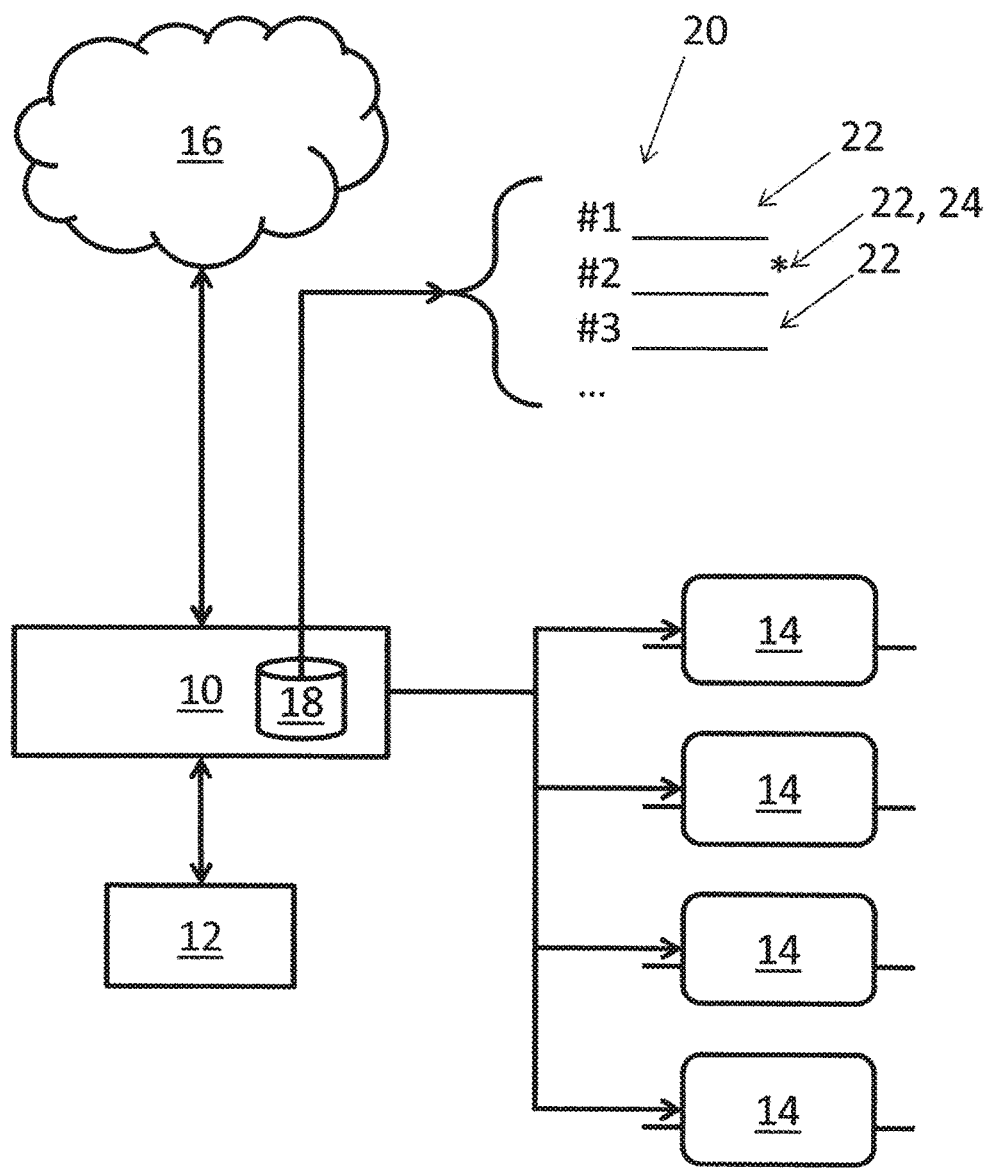

METHOD OF PREPARING A SETUP KIT FOR A PLACEMENT MACHINE

The present invention relates to a method of preparing a setup kit for at least one placement machine.

Placement machines (i.e., for example, pick-and-place machines or automatic placement machines) are used in the production of electronic circuit boards to place electric or electronic components on the circuit board. The components can e.g. be resistors, capacitors, integrated circuits (ICs), and the like. After the placing of the components on the circuit board by means of the placement machine, the placed components can be permanently electrically connected to the circuit board by means of a soldering process.

The electric or electronic components that are placed by the placement machine are typically provided in the placement machine in a store, a so-called feeder. In addition to feeders, trays can e.g. also be used for larger ICs for the storage of the components. A plurality of feeders and/or trays can be arranged within a shuttle table that can be inserted into a placement machine. The shuttle table comprises a limited capacity to receive different components so that the components stored in the shuttle table may have to be changed for the placement of different assemblies or circuit boards. For example, a set of components in the shuttle table is in this respect called a setup kit for the placement machine.

If the setup kit has to be respectively changed for the manufacture of different assemblies, downtimes of the placement machine arise that cause costs and in particular drive up the manufacturing costs for small volumes of assemblies/circuit boards.

It is conventionally attempted to compose a setup kit for the placement machine, with which ideally a plurality of different assemblies can be manufactured without changing the setup kit, on the basis of experience or a "gut feeling".

With such setup kits, there are nevertheless disadvantageously repeated down time phases of the placement machine in which the setup kit of the placement machine has to be changed.

It is therefore the underlying object of the invention to provide a method of preparing a setup kit for a placement machine which minimizes downtimes.

This object is satisfied in accordance with the invention by a method in accordance with claim 1.

In accordance with the invention, a method of preparing a setup kit for at least one placement machine is provided, wherein the placement machine serves for the placement of components on/at assemblies, and wherein
  those components that are required for the assemblies for a plurality of different assemblies to be manufactured are determined by means of the placement machine;
  possible setup kits for the placement machine are prepared iteratively from the determined components, with each setup kit comprising a plurality of components; and
  an optimized setup kit is selected from the setup kits
by means of an electronic processing device in the method.

In other words, in accordance with the invention, the components to be processed by the placement machine (for different assemblies) are determined and are compiled in a list, for example. Combinations of a respective plurality of components are subsequently formed, i.e. possible setup kits are prepared. Finally, an optimized setup kit is selected from the possible setup kits, with the optimized setup kit, for example, permitting the manufacture of a plurality of assemblies without a setup change or only with a very small setup change effort.

The invention here builds on the recognition that the disadvantages of preparing a setup kit by a "gut feeling" can be compensated by using an electronic processing device since the electronic processing device provides the possibility of evaluating and thus "trying out" a very large number of possible setup kits. The invention is therefore also particularly suitable for electronic productions that have a high variation of different assemblies with a simultaneous small batch size. A plurality of assemblies is to be understood as at least three assemblies, preferably at least five assemblies, and particularly preferably at least ten or one hundred assemblies.

As mentioned, initially all the components required for the assemblies to be manufactured are preferably determined for the trying out phase. In particular the components to be placed on the upper side and on the lower side of a circuit board are considered here. For this purpose, the components of the assemblies can be entered into a list, with like components that are used in a plurality of assemblies preferably only being entered once. Subsequently, different combinations of the determined components are prepared, with in particular many components being included in a combination as a respective maximum that the components can be received by the placement machine, i.e. e.g. fit in its shuttle table or store. Finally, the optimized setup kit is selected from the setup kits produced in this manner. The downtimes are then reduced or can even be disposed of altogether with the optimized setup kit. This enables considerable cost savings in the operation of the placement machine. In addition, it is made possible also to produce small batches or even single pieces at the same small manufacturing costs as large batches.

The placement machine can in particular also be a line of a plurality of individual placement machines connected after one another. In this case, the line is also considered as a single placement machine, i.e. respective possible setup kits and the optimized setup kit is determined and selected for the total line. Such a setup kit can then, however, include a correspondingly large number of different components.

A placement machine can also be called an automatic placement machine or a pick-and-place machine. The placement machine preferably serves, as already stated above, for circuit board production and/or for the placement of circuit boards with electronic components. A circuit board can also be called a printed circuit board (PCB).

An assembly is in particular to be understood as a circuit board comprising the electronic components to be placed thereon. An assembly can also be a PCBA (printed circuit board assembly). The assemblies that are taken into account in the determination of the components to be processed can in particular be those assemblies that are to be produced within a predetermined time interval. The assemblies can, for example, be used that are to be produced within the next week, the next month, or within the next quarter.

The method in accordance with the invention can preferably be carried out fully automatically in full or at least in parts, i.e. without any interaction of a user. The determination of the components and/or the determination of the possible setup kits in particular takes/take place fully automatically. The optimized setup kit can also be selected fully automatically from the possible setup kits.

The optimized setup kit can be displayed and/or output, whereupon the placement machine is then equipped with the optimized setup kit. The equipping can take place, for example, by an operator of the placement machine or also automatically by means of a robot. Finally, in particular those assemblies are produced that can be manufactured using the optimized setup kit.

The method in accordance with the invention can in particular also be carried out autonomously. The method is here repeatedly started in an automatic manner, e.g. at predefined time intervals, to determine an optimized setup kit on the basis of the respective assemblies instantaneously to be produced.

Advantageous further embodiments of the invention can be seen from the description, from the drawing and from the dependent claims.

In accordance with a first advantageous embodiment, at least 10,000 ($10^4$), preferably at least 10 million ($10^7$), particular preferably at least 10 billion ($10^{10}$) possible setup kits are prepared. It is also possible to prepare an even larger number of possible setup kits, e.g. $10^{12}$ or $10^{15}$ possible setup kits. The probability of finding a setup kit that enables the manufacture of the assemblies without a change to the setup kit or with only very small changes to the setup kit is increased by the iterative generation of a particularly large number of setup kits.

In accordance with a further advantageous embodiment, the components that are required for manufacturing the assembly or assemblies to be produced most frequently are included in every possible setup kit. In other words, the components of the most frequent assembly or assemblies are set in a fixed manner. The components of three or five (or of any other predefined number) of the assemblies to be produced the most frequently can thus, for example, be included in every possible setup kit. In this manner, the number of possible combinations for the setup kit and thus the number of possible setup kits are considerably reduced. The possible setup kits and thus also the optimized setup kit can be determined with a smaller processing effort and/or in a shorter time due to the reduction of possible combinations of the components.

The preparation of a possible setup kit can generally be considered a "drawing without replacing", with drawing taking place from the set of components for so long until the capacity of the placement machine is reached. The sequence of the "drawn" components is of no importance here.

The exemplary case should be observed in the following that 650 different assemblies should be produced with one placement machine, with a total of 5,000 different components being required for the production of these assemblies. It is assumed that the placement machine can take up 300 different components in one setup kit. In other words, a drawing from a set of 5,000 components takes place 300 times without replacement. The number of possible combinations or setup kits R for this procedure is calculated according to the formula $$R=n!/(k!(n-k)!)$$

where n is the number of components (5,000) and k is the number of drawn components (300). An order of magnitude of $10^{491}$ results for the number of possible setup kits R. It is therefore not even possible with today's computer technology to determine all the possible setup kits iteratively in a reasonable time. The number of possible setups is only reduced so far that, for example, 80% or 100% of the then still possible setup kits are iteratively prepared for the placement machine by the reduction of the possible combinations due to the fixedly set components of the assemblies to be produced most frequently.

In accordance with a further advantageous embodiment, that setup kit is selected as the optimized setup kit with which the greatest number of different assemblies can be produced. For example, that possible setup kit can therefore be selected as the optimized setup kit with which e.g. 450 of the aforesaid 650 assemblies can be produced (without any change to the setup kit). A determination can be made for each setup kit for this purpose as to how many assemblies can be produced with the respective possible setup kit.

The electronic processing device can preferably only temporarily store that setup kit on the iterative determination of possible setup kits with which the greatest number of different assemblies can be produced. If a new setup kit is found that enables the production of a larger number of assemblies, the previously stored setup kit is replaced with the new setup kit. The memory requirements of the electronic processing device can hereby be reduced. It is equally possible that only one respective number of the best possible setup kits is temporarily stored.

In accordance with a further advantageous embodiment, that setup kit is selected as the optimized setup kit with which the most assemblies can be produced. More precisely, the respective likely volume per time unit can be determined for the assemblies, with that setup kit then being selected as the optimized setup kit with which the most assemblies can be produced in the time unit. For example, a possible setup kit can then be selected as the optimized setup kit with which admittedly only five different assemblies can be produced, with these assemblies, however, comprising e.g. 95% of all the assemblies to be produced in the time unit.

In a corresponding manner, the electronic processing device can also respective only store that possible setup kit or can only temporarily store a predetermined number of the best possible setup kits with which the most assemblies can be produced in the time unit.

After the iterative generation of the possible setup kits, an output can also simultaneously be made as to which setup kit enables the manufacture of the greatest number of different assemblies and which setup kit enables the manufacture of most assemblies. In addition, the respective five "best" setup kits can also be displayed and/or output.

In accordance with a further advantageous embodiment, the possible setup kits substantially completely utilize the intake capacity of the placement machine. This means that the possible setup kits include so many components that a further component no longer has space in the setup kit (and thus in the placement machine).

Electronic computers are, for example, provided to the placement machine by means of reels in a feeder, by means of trays and/or by means of tubes, and in particular in the shuttle table. The reels can be of different widths in dependence on the component width. Depending on the width of the reel, the respective reel can occupy one or more numbers of tracks of the placement machine. The reels or the belts rolled on the reels can typically have a width of 8 mm, with the placement machine (or a line of a plurality of placement machines) being able to have, for example, up to 320 different tracks and with accordingly up to 320 different components being able to be placed in a setup kit.

In accordance with an alternative embodiment, the possible setup kits only make use of part of the intake capacity of the placement machine, for example 30%, 40%, 50%, 60%, 70%, 80%, or 90%. Even if the setup kit then, for example, only covers 80% of the intake capacity of the placement machine, it can be assumed that a very large number of different assemblies can be produced with this setup kit.

To produce all the required assemblies, the remaining e.g. 20% of the intake capacity of the placement machine can be placed such that the respectively just produced assembly can be produced ("on the fly placement"). In this manner, a production of all the assemblies can be made possible with a very small setup change effort. For this purpose, it is preferably possible to determine possible manufacturing sequences of the assemblies, in particular all of the possible manufacturing sequences, and the thus required setup changes associated therewith, again iteratively and based on a partial setup kit, with then that production sequence being selected that manages with the least setup changes. A setup change is to be understood as the replacement of a component in the shuttle table of the placement machine.

In accordance with a further advantageous embodiment, the iterative determination of the possible setup kits and/or the selection of the optimized setup kit takes/take place by means of distributed computer systems, for example by means of cloud computing. Due to the large number of possible setup kits, a very high processing power may be required to determine the possible setup kits and/or the optimized setup kit. The processing power can be increased and thus the time duration of the determination of the optimized setup kit can be reduced by the sharing of the calculation over different computer systems. Very powerful computers can be made use of as required by cloud computing. The use of distributed computer systems is possible in a simple manner since the iterative process of determining possible setup kits can be parallelized in a simple manner, for example by means of "divide and conquer" principles.

The electronic processing device can therefore comprise a plurality of distributed computer systems and in particular cloud computers. The electronic processing device is preferably outside the placement machine and/or is separate from the placement machine.

The parallelization of the processing is preferably carried out if the preparation of the possible setup kits were to exceed a predefined time duration. If the electronic processing device determines, for example, that the preparation of the possible setup kits will probably take longer than three hours, additional computer systems are made use of to prepare the possible setup kits.

The preparation of possible setup kits is preferably aborted as soon as a setup kit has been found with which all the assemblies can be manufactured. The term "all of the assemblies" relates to the assemblies that were taken into account in the compilation of the components.

In accordance with a further advantageous embodiment, the information on the components and/or on the assemblies come from an enterprise resource planning system (ERP system) and/or from a product lifecycle management system (PIM system). The respective components, the track width of the components, the planned volume of the assemblies per time unit, the probable number of production jobs for the respective assembly per time unit and/or additional information can be stored in the ERP system and/or in the PLM system for every assembly. This information can be used in the determination of the possible setup kits and in the selection of the optimized setup kit. In this respect, a networking of the ERP system and/or of the PLM system with the electronic processing device and/or the placement machine can be present.

In accordance with a further advantageous embodiment, the arrangement and/or sequence of the components in the optimized setup kit is/are optimized, in particular by means of a processing device of the placement machine, such that the time effort for the placement of the assemblies is minimized. For example, components can be arranged at positions that are to be reached fast by the placement machine and that are used frequently.

In accordance with a further advantageous embodiment, all the components or at least some of the components included in the optimized setup kit are communicated to a circuit board design program, whereupon in particular the respective components included in the optimized setup kit are preferably used in the circuit board design program. The circuit board design program can be a PCB (printed circuit board) design program such as "Eagle CAD". In this manner, a feedback of the optimized setup kit to the design process of future assemblies is provided so that the designer of the assemblies preferably uses the components anyway included in the setup kit, whereby then a change to the setup kit can be avoided in the manufacture of new assemblies.

In accordance with a further advantageous embodiment which components are required in all the assemblies or in a predefined proportion of the assemblies is determined before the iterative determination of possible setup kits, with the components determined in this process being set in each iteratively determined setup kit. If it is therefore determined, for example, that a component, e.g. a resistor having the value 1 k$\Omega$, is used in all the assemblies, this component is fixedly set and is consequently included in every iteratively determined setup kit. The number of possible setup kits can be greatly reduced in this manner, whereby the processing power to be used and/or the time can be considerably reduced.

In accordance with a further advantageous embodiment, the method is only carried out for a predefined number of the most frequently produced assemblies. This means that the method is, for example, carried out for five or for ten assemblies whose volumes per time unit is the highest and/or that have most production jobs. A reduction of the possible combinations and thus a reduction in the required processing power or the required time can likewise be achieved by the restriction to the most frequently produced assemblies.

In accordance with a further advantageous embodiment, how often components of the respective setup kit would have to be replaced to be able to produce all the different assemblies is determined at least for an iteratively determined setup kit. If therefore, for example, no optimized setup kit can be found with which all the required assemblies can be produced, how many setup changes are necessary to be able to produce all the assemblies can be determined at least for an iteratively determined setup kit or for a predefined number of iteratively determined setup kits. Subsequently, that setup kit can be selected as the optimized setup kit in which the fewest setup changes have to be carried out to be able to produce all the assemblies.

In accordance with a further advantageous embodiment, a sequence of the replacement of components of the setup kit and/or of the manufacture of the assemblies is determined in which the fewest components have to be replaced to produce all the assemblies. Different sequences of the replacement of components of the setup kit and/or of the manufacture of the assemblies can also be run through iteratively again for this purpose. The sequence found in this manner then enables an efficient production of the assemblies with small downtimes. The placement machine is used efficiently, on the one hand, due to the small downtimes. On the other hand, personnel costs can be saved that otherwise arise on setup changes.

In accordance with a further advantageous embodiment, an algorithm of machine learning, preferably an artificial neuronal network, is used to prepare the possible setup kits and/or to select the optimized setup kit. The algorithm of machine learning can, for example, also be used to determine the sequence of the replacement of components of a setup kit in the manufacture of all the assemblies. The algorithm of machine learning can in particular be trained with information on assemblies produced in the past and on components used therein to be able to make predictions and/or decisions as to which setup kit is to be selected as the optimized setup kit.

The invention further relates to an electronic processing device comprising a data interface, with the processing device being configured
- to determine those components that are required for the assemblies for a plurality of different assemblies to be manufactured by means of the placement machine;
- to prepare possible setup kits for the placement machine iteratively from the determined components, with each setup kit comprising a plurality of components;
- to select an optimized setup kit from the setup kits; and
- to output the optimized setup kit by means of the data interface.

The invention also relates to a system composed of a placement machine and an electronic processing device as explained above.

The statements on the method in accordance with the invention, in particular with respect to advantages and to preferred embodiments, apply accordingly to the electronic processing device in accordance with the invention and to the system in accordance with the invention.

Finally, the invention relates to a method of preparing a setup kit for a production machine, with the production machine attaching components to/at assemblies, wherein
- those components that are required for the assemblies for a plurality of different assemblies to be manufactured are determined by means of the production machine;
- possible setup kits for the production machine are prepared iteratively from the determined components, with each setup kit comprising a plurality of components;
- an optimized setup kit is selected from the setup kits by means of an electronic processing device in the method.

The idea in accordance with the invention can therefore not only be used for placement machines, but can generally be used within the framework of industrial production lines, with placement machines being supplied with components that, for example in automobile production, are attached to an automobile or to its body that is to be produced.

The statements made above, in particular with respect to advantages and preferred embodiments apply accordingly to the method using the production machine.

The invention will be described in the following purely by way of example with reference to the drawing. There is shown:

FIG. 1 schematically, a system with an electronic processing device and a plurality of placement machines.

FIG. 1 shows an electronic processing device in the form of a control computer 10 that is coupled by means of a data link to an enterprise resource planning system (ERP system) 12. The control computer 10 is connected to a plurality of placement machines 14 by means of a data interface (not shown).

The control computer 10 is additionally coupled to a plurality of cloud computers 16 via a data link. The control computer 10 can comprise the cloud computer 16.

The control computer 10 is configured to receive a list comprising assemblies to be produced within the next week from the ERP system 12. For each assembly, the ERR system 12 additionally transmits the respectively used components and the number to be produced of the respective assembly to the control computer 10. The control computer 10 stores this information in an internal memory 18.

The control computer 10 moreover receives information on the placement machines 14, in particular on their intake capacity for components.

After the receipt of the above-named information, the control computer 10 starts to prepare all the possible setup kits 22 for the placement machines 14 in that desired combinations of the components of all the assemblies are prepared iteratively. In this respect, the components of the five assemblies to be produced most frequently are included in each setup kit. How many of the assemblies to be manufactured are producible with the respective setup kit, and how large the total number of assemblies producible with the respective setup kit 22 is, is determined for each possible setup kit thus prepared. The control computer 10 can either determine possible setup kits 22 for each placement machine separately or all the placement machines 14 are considered as a production line and are thus treated as a single "large" placement machine 14.

If the control computer 10 determines that the production of the possible setup kits 22 would take longer than a predetermined time period (e.g. three hours), the control computer 10 outsources the production of some of the possible setup kits 22 to the cloud computer 16.

Once the possible setup kits 22 have been determined, the control computer 10 can store a setup kit list 20 having a plurality of possible setup kit list 20 in the memory 18. The setup kit list 20 also comprises the number of assemblies that can be manufactured with the respective setup kit 22. That setup kit 22 with which the most assemblies can be manufactured is then selected as the optimized setup kit 24 (marked by an "*!" in FIG. 1).

The optimized setup kit 24 is transmitted to the placement machines 14, whereupon the placement machines 14 carry out an optimization of the sequence of the components of the setup kit to enable a production of the assemblies that saves as much time as possible. Finally, the placement machines 14 are equipped with the optimized setup kit 24 and the production of the assemblies begins. The production of the assemblies can then ideally take place without any setup change of the placement machines 14.

REFERENCE NUMERAL LIST

10 control computer
12 ERP system
13 placement machine
16 cloud computer
18 memory
20 setup kit list
22 possible setup kit
24 optimized setup kit

The invention claimed is:

1. A method of preparing a setup kit for at least one placement machine, wherein the placement machine serves for the placement of components on/at assemblies, the method comprising the steps of:
- determining components that are required for assemblies for a plurality of different assemblies to be manufactured by the at least one placement machine;
- iteratively preparing possible setup kits for the at least one placement machine from the determined components, wherein each of the possible setup kits comprises a plurality of possible components selected from the determined components, wherein the plurality of possible components associated with each one of the possible setup kits comprises a unique combination of selected ones of the determined components; and selecting an optimized setup kit from the possible setup kits by means of an electronic processing device.

2. The method in accordance with claim 1, wherein one of at least 10,000, at least 10,000,000, and at least 10,000,000,000 possible setup kits are prepared.

3. The method in accordance with claim 1, wherein the components that are required to manufacture the assembly or assemblies to be produced most frequently are included in each possible setup kit.

4. The method in accordance with claim 1, wherein that possible setup kit is selected as the optimized set-up kit with which the greatest number of different assemblies can be produced.

5. The method in accordance with claim 1, wherein the respective probable volume per time unit is determined for the assemblies, with that possible setup kit being selected as the optimized setup kit with which the most assemblies can be produced in the time unit.

6. The method in accordance with claim 1, wherein the possible setup kits only utilize the intake capacity of the placement machine in part.

7. The method in accordance with claim 6, wherein the possible setup kits only utilize 80% of the intake capacity of the placement machine.

8. The method in accordance with claim 1, wherein at least one of the iterative determination of the possible setup kits and the selection of the optimized setup kit takes place by means of distributed computer systems.

9. The method in accordance with claim 8, wherein at least one of the iterative determination of the possible setup kits and the selection of the optimized setup kit takes place by means of cloud computing.

10. The method in accordance with claim 1, wherein the information on one of the components and the assemblies comes from at least one of an enterprise resource planning system and a product lifecycle management system.

11. The method in accordance with claim 1, wherein the components included in the optimized setup kit are communicated to a circuit board design program.

12. The method in accordance with claim 11, wherein the components that are communicated to the circuit board design program are used in the circuit board design program.

13. The method in accordance with claim 11, wherein following the communication of the components included in the optimized setup kit to the circuit board design program, the respective components included in the optimized setup kit are used in the circuit board design program.

14. The method in accordance with claim 1, wherein it is determined which components are required in one of all the assemblies and a predetermined proportion of the assemblies before the iterative determination of possible setup kits, with the components determined in this process being set in each iteratively determined possible setup kit.

15. The method in accordance with claim 1, wherein the method is only carried out for a predefined number of the assemblies produced the most frequently.

16. The method in accordance with claim 1, wherein it is determined for at least one iteratively determined possible setup kit how often a component of the respective setup kit would have to be replaced to produce all the assemblies.

17. The method in accordance with claim 16, wherein a sequence of the replacement of components of the setup kit and/or of the manufacture of the assemblies is determined in which the fewest components have to be replaced to produce all the assemblies.

18. The method in accordance with claim 1, wherein an algorithm of machine learning is used to prepare the possible setup kits and/or to select the optimized setup kit.

19. The method in accordance with claim 18, wherein the algorithm of machine learning is an artificial neuronal network.

20. An electronic processing device comprising a data interface, wherein the processing device is configured to:
   determine components that are required for assemblies for a plurality of different assemblies to be manufactured by a placement machine;
   prepare possible setup kits for the placement machine iteratively from the determined components, each of the possible setup kits comprising a plurality of possible components wherein the plurality of possible components associated with each one of the possible setup kits comprises a unique combination of selected ones of the determined components;
   select an optimized setup kit from the possible setup kits; and
   output the optimized setup kit using the data interface.

* * * * *